US012593428B2

(12) United States Patent
Simske et al.

(10) Patent No.: US 12,593,428 B2
(45) Date of Patent: Mar. 31, 2026

(54) VARIABLE DISTANCE SENSOR SECURITY DEVICES AND SYSTEMS

(71) Applicant: Colorado State University Research Foundation, Fort Collins, CO (US)

(72) Inventors: Steve Simske, Fort Collins, CO (US); Sean Lahti, Fort Collins, CO (US)

(73) Assignee: Colorado State University Research Foundation, Fort Collins, CO (US)

( * ) Notice: Subject to any disclaimer, the term of this patent is extended or adjusted under 35 U.S.C. 154(b) by 386 days.

(21) Appl. No.: 17/165,606

(22) Filed: Feb. 2, 2021

(65) Prior Publication Data

US 2021/0249821 A1 Aug. 12, 2021

Related U.S. Application Data

(60) Provisional application No. 62/971,372, filed on Feb. 7, 2020.

(51) Int. Cl.
*H05K 9/00* (2006.01)
(52) U.S. Cl.
CPC ......... *H05K 9/0052* (2013.01); *H05K 9/0049* (2013.01)
(58) Field of Classification Search
None
See application file for complete search history.

(56) References Cited

U.S. PATENT DOCUMENTS

| | | | | | |
|---|---|---|---|---|---|
| 5,545,844 | A | * | 8/1996 | Plummer, III ....... | H05K 9/0043 |
| | | | | | 174/363 |
| 10,477,741 | B1 | * | 11/2019 | Bae ...................... | H04B 1/3883 |
| 11,234,350 | B2 | * | 1/2022 | Embleton ............ | H05K 9/0015 |
| 2003/0057131 | A1 | * | 3/2003 | Diaferia ............... | H05K 9/0049 |
| | | | | | 206/320 |
| 2007/0297160 | A1 | * | 12/2007 | Cochrane ............. | H05K 9/0015 |
| | | | | | 361/818 |
| 2013/0313328 | A1 | * | 11/2013 | Mohajer-Iravani .... | H01Q 13/18 |
| | | | | | 235/492 |
| 2016/0205723 | A1 | * | 7/2016 | Reiffenrath .............. | H04M 1/11 |
| | | | | | 455/552.1 |

* cited by examiner

*Primary Examiner* — Allen L Parker
*Assistant Examiner* — Christopher L Augustin
(74) *Attorney, Agent, or Firm* — Robinson IP Law, PLLC

(57) ABSTRACT

Various implementations include a casing device for controlling the distance and direction of readability of a wave. The casing device includes at least one wall having an outer surface and an inner surface that defines a chamber. The at least one wall has at least a first wall portion and a second wall portion. At least the first wall portion includes an electrically conductive material. At least the second wall portion defines an aperture extending from the outer surface to the inner surface.

26 Claims, 3 Drawing Sheets

VARIABLE DISTANCE SENSOR SECURITY DEVICES AND SYSTEMS

CROSS-REFERENCE TO RELATED APPLICATIONS

This application claims the benefit of U.S. Provisional Patent Application No. 62/971,372, filed Feb. 7, 2020, the contents of which are incorporated herein by reference in their entirety.

BACKGROUND

Many current electronic devices use a variety of wireless signals to receive and transmit data from a user or within a larger wireless system. Many times, those electronic devices are left outside the home of a user or unattended in general. Leaving these electronic devices unattended can place them at risk for tampering or war-driving. War-driving is searching for unsecured wireless connections to acquire settings of Wi-Fi wireless networks, Bluetooth signals, or other devices using a wireless laptop and portable global positioning system (GPS). War-driving can lead to stolen information, misuse of a wireless network, or a possible security breach.

Furthermore, wirelessly transmitted signals are often employed for communication with automated machinery in industrial manufacturing operations. However, the signals transmitted by two or more machines can cause interference with each other's signals, causing the signals to become unreadable.

Thus, a need exists for a device that can protect electronic devices from tampering or wardriving and can be used to prevent other wave based signals from interfering with the readability of the electronic device's transmission.

SUMMARY

Various implementations include a casing device. The casing device includes at least one wall having an outer surface and an inner surface defining a chamber. The at least one wall has at least a first wall portion and a second wall portion. At least the first wall portion includes an electrically conductive material. At least the second wall portion defines an aperture that extends from the outer surface to the inner surface.

In some implementations, the electrically conductive material includes a metal.

In some implementations, the electrically conductive material includes copper.

In some implementations, the electrically conductive material includes a conductive polymer.

In some implementations, the electrically conductive material includes a continuous piece in electrical communication.

In some implementations, the at least one wall further includes an electrically non-conductive material. The electrically conductive material is embedded in the electrically non-conductive material.

In some implementations, either the first wall portion or the second wall portion includes a door for allowing access to the chamber.

In some implementations, the door includes hinges pivotably coupling the door to the first wall portion or the second wall portion.

In some implementations, the second wall portion includes an electrically conductive material.

In some implementations, a first amount of electrically conductive material included in a first portion of one of the first wall portion or the second wall portion is different from a second amount of electrically conductive material included in a second portion of the one of the first wall portion or the second wall portion.

Various implementations include a system for controlling the distance and direction of readability of a wave. The system includes a casing device and a transmitting device. The casing device includes at least one wall having an outer surface and an inner surface defining a chamber. The at least one wall has at least a first wall portion and a second wall portion. At least the first wall portion includes an electrically conductive material. At least the second wall portion defines an aperture extending from the outer surface to the inner surface. The transmitting device is disposed within the chamber. The transmitting device is capable of transmitting a wave signal.

In some implementations, the electrically conductive material includes a metal.

In some implementations, the electrically conductive material includes copper.

In some implementations, the electrically conductive material includes a conductive polymer.

In some implementations, the electrically conductive material includes a continuous piece in electrical communication.

In some implementations, the at least one wall further includes an electrically non-conductive material. The electrically conductive material is embedded in the electrically non-conductive material.

In some implementations, either the first wall portion or the second wall portion includes a door for allowing access to the chamber.

In some implementations, the door includes hinges pivotably coupling the door to the other of the second wall portion or first wall portion.

In some implementations, the second wall portion includes an electrically conductive material.

In some implementations, a first amount of electrically conductive material included in a first portion of one of the first wall portion or the second wall portion is different from a second amount of electrically conductive material included in a second portion of the one of the first wall portion or the second wall portion.

In some implementations, the wave signal is electromagnetic interference (EMI).

In some implementations, the wave signal is radio-frequency identification (RFID).

In some implementations, the wave signal includes readable data. The first wall portion is configured to include enough electrically conductive material such that the readable data of the wave signal transmitted through the first wall portion is not readable beyond a maximum distance from the transmitting device. The maximum distance is less than 1 meter.

In some implementations, a communication signal transmitted externally from the chamber through the first wall portion is not readable by the transmitting device beyond the maximum distance.

In some implementations, the second wall portion is configured such that the readable data of the wave signal transmitted through the aperture of the second wall portion is readable at a distance beyond the maximum distance.

In some implementations, the distance that the readable data of the wave signal transmitted through the aperture of the second wall portion is from 30 meters to greater than 1 meter.

BRIEF DESCRIPTION OF DRAWINGS

Example features and implementations are disclosed in the accompanying drawings. However, the present disclosure is not limited to the precise arrangements and instrumentalities shown.

DETAILED DESCRIPTION

The devices, systems, and methods disclosed herein provide for a casing device for limiting the distance and direction of readability of a wave signal transmitted by a transmitting device disposed within the casing device. Different portions of the walls of the casing device include varying amounts of electrically conductive material. The electrically conductive material of the casing device is configured to shunt the readability of wave signals transmitted into and out of the casing device. The walls of the casing devices disclosed herein are designed to include specific amounts of electrically conductive material based on the transmitting device and the transmitted wave signals. The specific amounts of electrically conductive material included in the wall portions shunt the transmitted wave signals to provide desired distances of readability of the transmitted wave signals through different portions of the walls of the casing device. Thus, the casing devices disclosed herein provide for controlled limitation of the distance of readability of wave signals transmitted by the transmitting device in different directions.

Various implementations include a casing device. The casing device includes at least one wall having an outer surface and an inner surface defining a chamber. The at least one wall has at least a first wall portion and a second wall portion. At least the first wall portion includes an electrically conductive material. At least the second wall portion defines an aperture that extends from the outer surface to the inner surface.

Various implementations include a system for controlling the distance and direction of readability of a wave. The system includes a casing device, as described above, and a transmitting device. The transmitting device is disposed within the chamber. The transmitting device is capable of transmitting a wave signal.

FIGS. 1-4 show a system 100 for controlling the distance and direction of readability of a wave, according to one implementation. The system includes a casing device 110 and a transmitting device 170.

Figure 1:
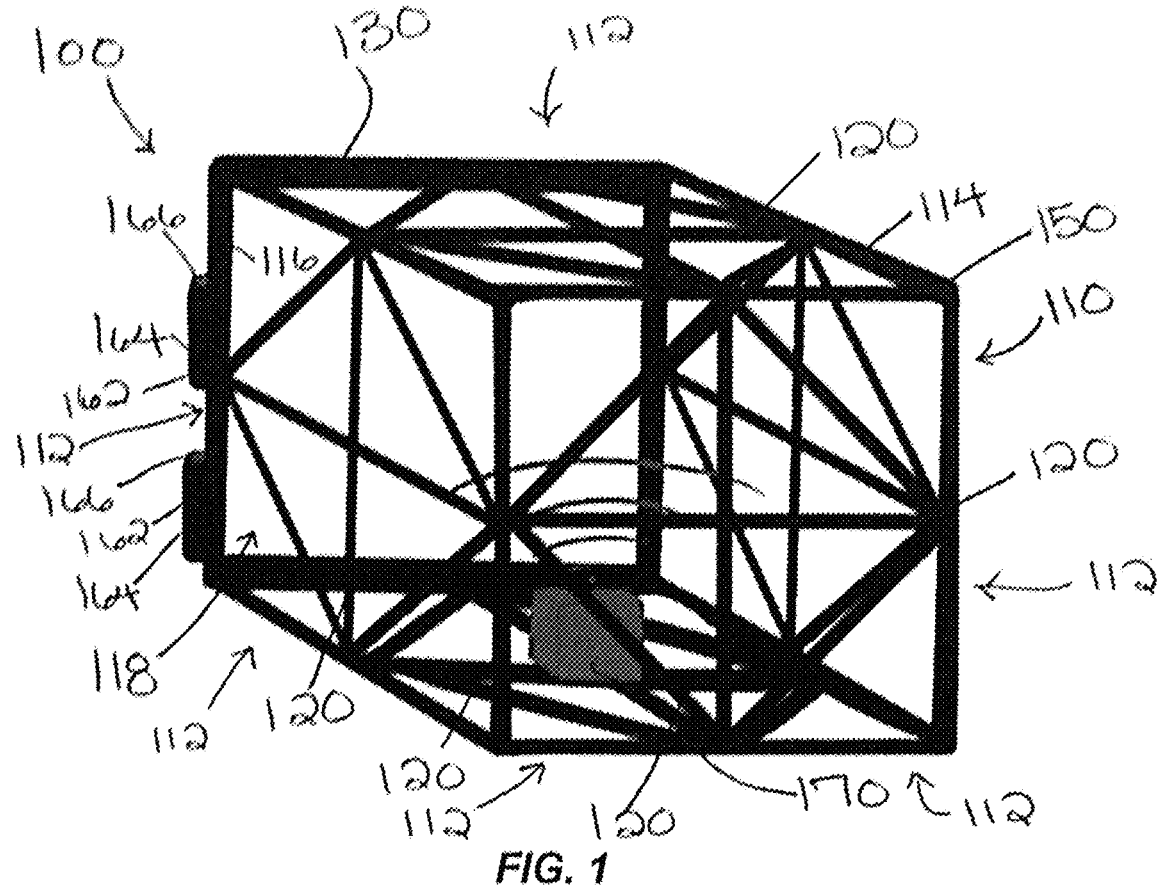
FIG. 1 is a perspective view of a casing device and a transmitting device, according to one implementation.
Figure 2:
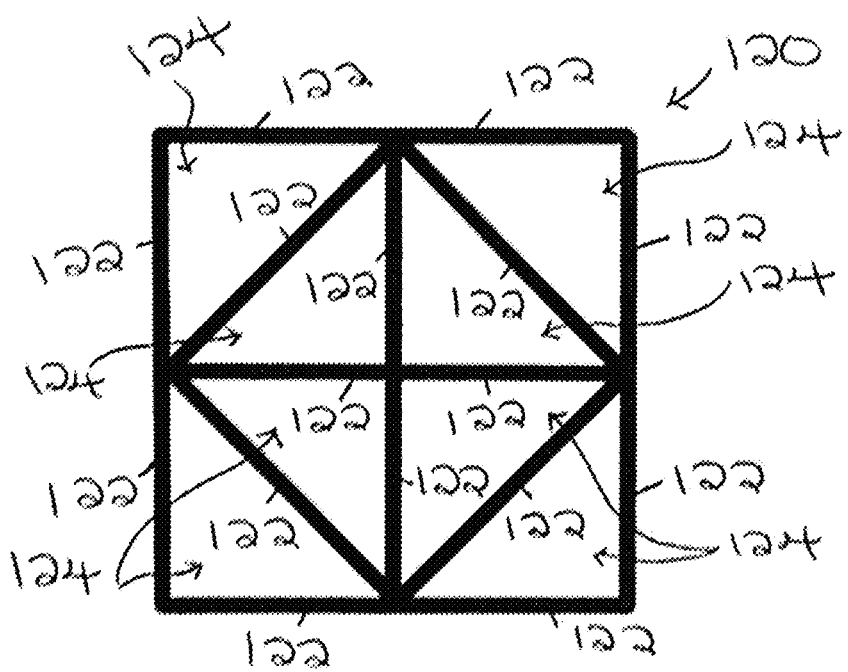
FIG. 2 is a front view of a first wall portion of the casing device of FIG. 1.

The casing device 110 is a cube and has six walls 112, an outer surface 114, and an inner surface 116 defining a chamber 118. In FIG. 1, five of the six walls 112 of the casing device 110 include first wall portions 120. FIG. 2 illustrates a front view of one of the five walls 112 that includes a first wall portion 120. The first wall portions 120 shown in FIGS. 1-3 and 5 are square panels that include first wall portion members 122.

The first wall portion members 122 extend around the perimeter of, and across, the first wall portion 120 such that the first wall portion members 122 define triangular openings 124. While the first wall portion members 122 define triangular openings 124 in the implementations shown in FIGS. 1-5, in other implementations, the first wall portion members define circular openings, square openings, rectangular openings, any other shape openings, or no openings such that the first wall portion is solid. Also, in other implementations, the first wall portion includes one, two, three, four, or any number of first wall portion members.

Figure 3:
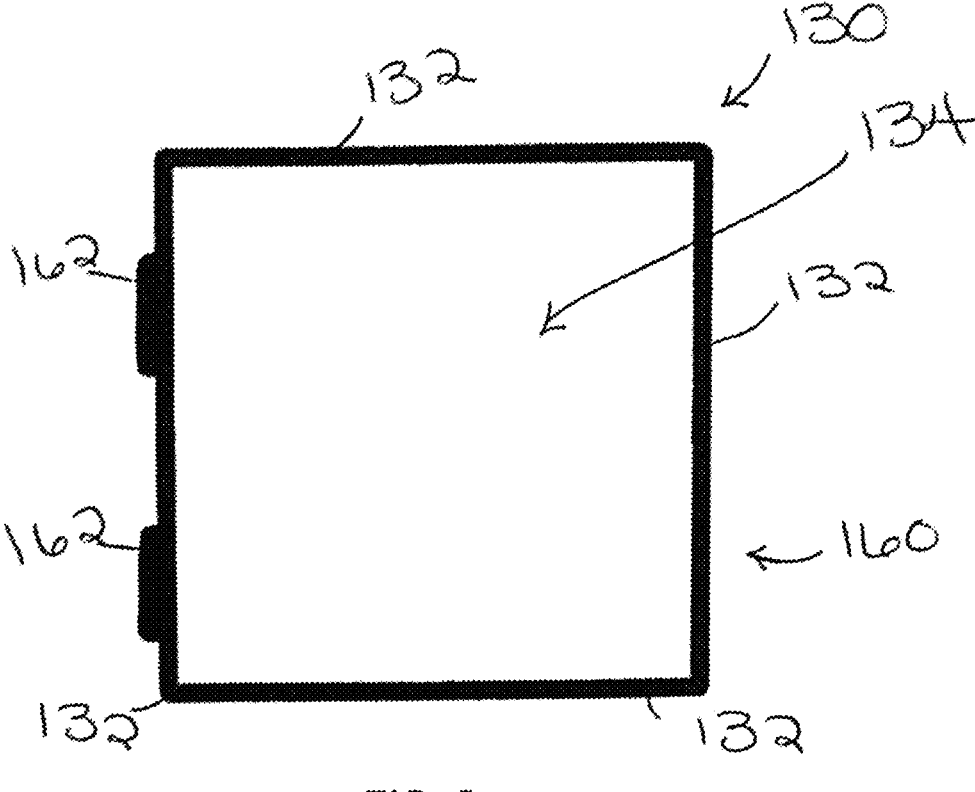
FIG. 3 is a front view of a second wall portion of the casing device of FIG. 1.

The remaining, sixth wall 112 of the casing device 110 includes a second wall portion 130. FIG. 3 illustrates a front view of the wall 112 that includes a second wall portion 130. The second wall portion 130 is a square panel that includes second wall portion members 132. The second wall portion members 132 extend around the perimeter of the second wall portion 130. The second wall portion members 132 define a square aperture 134 that is defined by a majority of the second wall portion 130.

While the aperture 134 is square in FIG. 1, in other implementations, the aperture is rectangular, circular, ovate, triangular, or any other closed shape. While the square aperture 134 corresponds to the shape of the second wall portion 132 in FIG. 1, in other implementations, the shape of the aperture corresponds to any other shape other than the shape of the second wall portion.

The first wall portion members 122 and the second wall portion members 132 include an electrically conductive material 140 embedded in an electrically non-conductive material 150. The electrically non-conductive material 150 adds structural support to the casing device 110. In FIGS. 1-4, the electrically conductive material 140 is copper, and the electrically non-conductive material 150 is acrylonitrile butadiene styrene. In other implementations, the electrically non-conductive material is any thermoplastic polymer, such as polylactic acid, or any other electrically non-conductive material. The electrically conductive material 140 is in the form of copper wiring running through the first wall portion members 122 and the second wall portion members 132 and is illustrated without the electrically non-conductive material 150 in FIG. 4. The copper wiring is a continuous piece of wire in electrical communication with itself.

Although the electrically conductive material 140 shown in FIGS. 1-5 is copper, in some implementations, the electrically conductive material includes a metal such as silver, gold, any other electrically conductive metal, or any combination thereof. In other implementations, the electrically conductive material includes a conductive polymer such as polyacetylene, polypyrrole, polyindole and polyaniline, any other polymer that is electrically conductive, or any combination thereof. In other implementations, the electrically conductive material includes any material that is capable of conducting electricity.

In some implementations, the second wall portion members do not include electrically conductive material. In some implementations, one or more of the first wall portion members do not include an electrically conductive material. While the aperture 134 shown in FIG. 1 is open, in other implementations, the aperture is a closed wall of electrically non-conductive material or any configuration of electrically non-conductive material such that the aperture does not include any electrically conductive material extending across the aperture.

Figure 4:
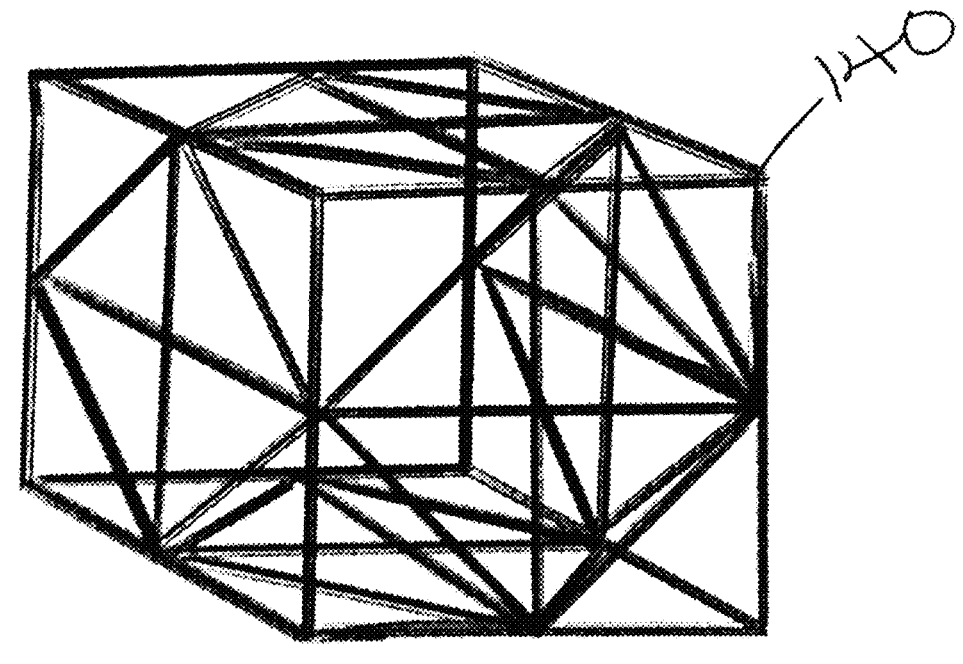
FIG. 4 is a perspective view of the electrically conductive material of the casing device of FIG. 1.

Although the electrically conductive material 140 shown in FIG. 4 includes a continuous piece of wire, in other implementations, the electrically conductive material includes two or more continuous pieces of wire. In some implementations, the electrically conductive material includes individual pieces or particles of the electrically conductive material embedded within the electrically non-conductive material. In some implementations, only part of, or none of, the portions of the electrically conductive material is in electrical communication with any of the other portion of the electrically conductive material.

As shown in FIGS. 1 and 3, the second wall portion 130 includes a door 160 for allowing access to the chamber 118 of the casing device 110. The second wall portion 130 includes two hinge portions 162, and one of the adjacent walls includes two complimentary hinge portions 164. The hinge portions 162 are coupled to each other with a pin 166 to pivotably couple the second wall portion 130 to the casing device 110.

The five of the six walls 112 of the casing device 110 that include first wall portions 120 shown in FIG. 1 are integrally formed together through additive manufacturing, but, in other implementations, the walls are mechanically coupled via an interference fit, adhesives, fitted slots, clamps, squeezable pins, or any other mechanical coupling capable of holding the walls of the casing device together. Although the walls of the casing device in FIGS. 1-4 are integrally formed with additive manufacturing, in other implementations, the walls of the casing device are integrally formed through molding, forming, welding, or any other manufacturing process capable of integrally forming walls of the casing device.

While the casing device shown in FIGS. 1-4 is a cube, in other implementations, the casing device is a sphere, rectangular prism, triangular prism, cylinder, or any other three-dimensional shape capable of having an inner surface defining a chamber. In other implementations, the casing device includes one, two, three, four, or any number of walls, and each of the walls include any number of first wall portions, second wall portions, or both. In some implementations, one or more walls do not include either a first wall portion or a second wall portion.

Figure 5:
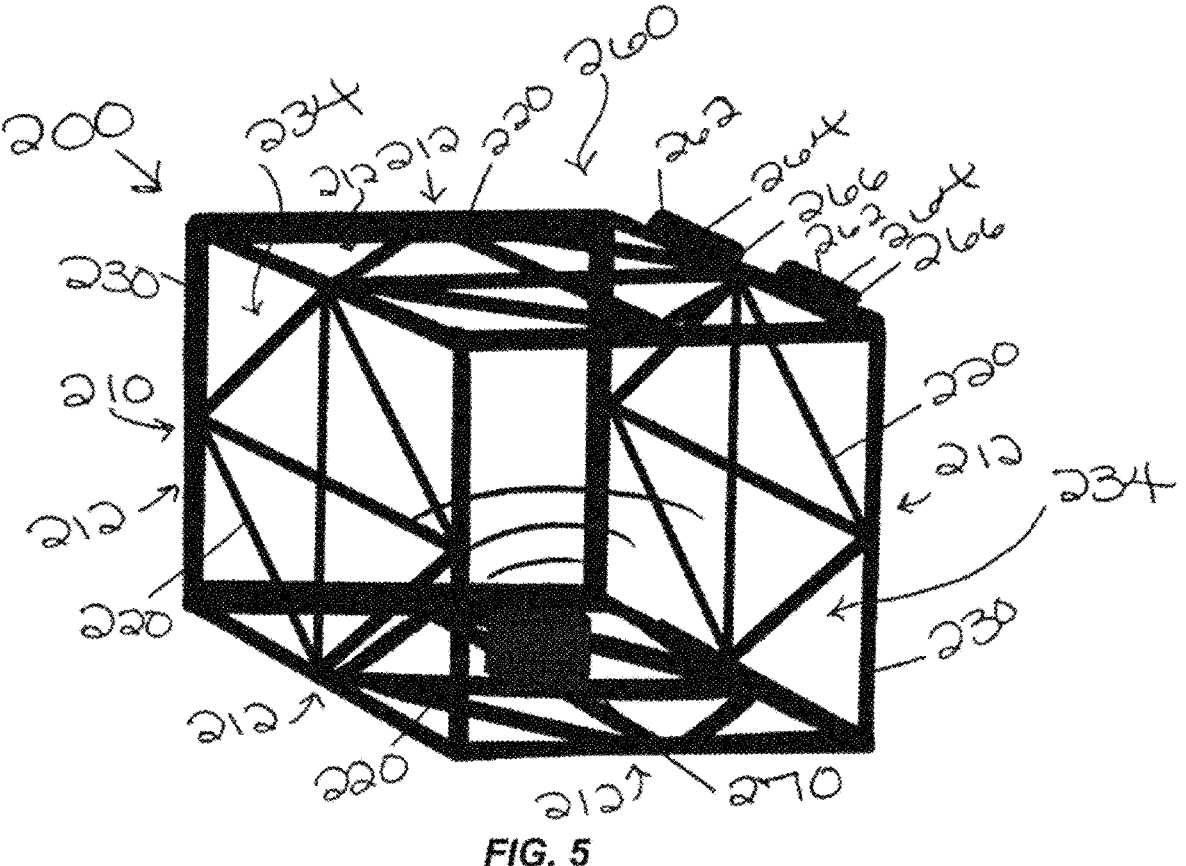
FIG. 5 is a perspective view of a casing device and a transmitting device, according to one implementation.

FIG. 5 shows another implementation of a casing device 210 that includes four walls 212 with first wall portions 220 and two walls with second wall portions 230. The two walls 212 that include second wall portions 230 are spaced opposite each other, and one of the first wall portions 220 includes the door 260. The first wall portions 220 include first wall portion members 222, and the second wall portions 230 include second wall portion members 232 both of which include electrically conductive material 240 similar to the electrically conductive material 140 shown in FIG. 4.

As described above, the door 260 includes two hinge portions 262, and one of the adjacent walls that includes a first wall portion 220 includes two complimentary hinge portions 264. The hinge portions 262 and complimentary hinge portions 264 are coupled to each other with a pin 266 to pivotably couple the one of the first wall portions 220 to another of the first wall portions 220. In other implementations, the door is hingedly coupled to another wall of the casing device such that the hinge portions and complimentary hinge portions are on the corresponding second wall portion or first wall portion. In other implementations, the door is removably or slidably coupled to another wall of the casing device. In other implementations, the casing device does not include a door such that the walls of the casing device are fixedly coupled to another wall of the casing device. In some implementations, the first wall portion and/or the second wall portion includes the door.

The transmitting devices 170, 270 disposed within the chambers 118, 218 of the casing devices 110, 210 shown in FIGS. 1 and 5 are capable of transmitting a wave signal, specifically an RFI (radio-frequency identification) wave signal. However, in other implementations, the wave signal transmitted by the transmitting device is ultra-high frequency (UHF) radio waves such as Bluetooth, electromagnetic interference (EMI), or any other wave signal.

The casing device 110, 210 is configured to shunt the readability of wave signals transmitted into and out of the casing device 110, 210 through a first wall portion 120, 220 or a second wall portion 130, 230. Specifically, the first wall portions 120, 210 are configured to reduce the readability of the wave signals to a first minimum distance, and the second wall portions 130, 230 are configured to reduce the readability of the wave signals to a second minimum distance which is greater than the first minimum distance, as described in more detail below.

The wave signal includes readable data, and the first wall portion 120, 220 is configured to include enough electrically conductive material 140, 240 such that the readable data of the wave signal transmitted through the first wall portion 120, 220 is not readable beyond less than 1 meter from the transmitting device 170, 270.

On the other hand, the second wall portion 130, 230 of the casing device 110, 210 is configured such that the readable data of the wave signal that is transmitted through the square aperture 134, 234 of the second wall portion 130, 230 is readable at a distance beyond 1 meter.

In some implementations, the distance that the readable data of the wave signal transmitted through the aperture of the second wall portion is from 30 meters to greater than 1 meter.

Furthermore, the amount, or density, of electrically conductive material 140, 240 in the first wall portions 120, 220 and second wall portions 130, 230 are selected to limit the readable distance of waves through the first wall portions 120, 220 and second wall portions 130, 230 based on the transmitting device and the transmitted wave signal. The amounts of electrically conductive material 140, 240 in each of the first wall portions 120, 220 and second wall portions 130, 230 can be graded differently in different areas to achieve the desired shunting effects of the transmitted wave signal.

For example, in some implementations, the amount or distribution of electrically conductive material in the first wall portion members is different than the amount of electrically conductive material in the second wall portion members. In other implementations, the amount of electrically conductive material in a portion of the first wall portion is different than the amount of electrically conductive material in another portion of the first wall portion. In further implementations, the amount of electrically conductive material in a portion of the second wall portion is different than the amount of electrically conductive material in another portion of the second wall portion.

In some implementations, a communication signal transmitted externally from the chamber through the first wall portion is not readable by the transmitting device beyond 1 meter.

A number of example implementations are provided herein. However, it is understood that various modifications can be made without departing from the spirit and scope of the disclosure herein. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. Although the terms "comprising" and "including" have been used herein to describe various implementations, the terms "consisting essentially of" and "consisting of" can be used in place of "comprising" and "including" to provide for more specific implementations and are also disclosed.

Disclosed are materials, systems, devices, methods, compositions, and components that can be used for, can be used in conjunction with, can be used in preparation for, or are products of the disclosed methods, systems, and devices. These and other components are disclosed herein, and it is understood that when combinations, subsets, interactions, groups, etc. of these components are disclosed that while specific reference of each various individual and collective combinations and permutations of these components may not be explicitly disclosed, each is specifically contemplated and described herein. For example, if a device is disclosed and discussed each and every combination and permutation of the device, and the modifications that are possible are specifically contemplated unless specifically indicated to the contrary. Likewise, any subset or combination of these is also specifically contemplated and disclosed. This concept applies to all aspects of this disclosure including, but not limited to, steps in methods using the disclosed systems or devices. Thus, if there are a variety of additional steps that can be performed, it is understood that each of these additional steps can be performed with any specific method steps or combination of method steps of the disclosed methods, and that each such combination or subset of combinations is specifically contemplated and should be considered disclosed.

What is claimed is:

1. A casing device for controlling the distance and direction of readability of a wave, the casing device comprising at least one wall having an outer surface and an inner surface defining a chamber, the at least one wall having at least a first wall portion and a second wall portion, wherein at least the first wall portion includes an electrically conductive material, and wherein at least the second wall portion defines an aperture extending from the outer surface to the inner surface, wherein a first amount of electrically conductive material included in a first portion of electrically conductive material of one of the first wall portion or the second wall portion is different from a second amount of electrically conductive material included in a second portion of electrically conductive material of the one of the first wall portion or the second wall portion, wherein the first amount and the second amount are greater than zero, wherein the first portion of electrically conductive material reduces the readability of a wave signal transmitted through the first portion of electrically conductive material to a first minimum distance, and the second portion of electrically conductive material reduces the readability of the wave signal transmitted through the second portion of electrically conductive material to a second minimum distance, wherein the second minimum distance is greater than the first minimum distance.

2. The casing device of claim 1, wherein the electrically conductive material comprises a metal.

3. The casing device of claim 2, wherein the electrically conductive material comprises copper.

4. The casing device of claim 1, wherein the electrically conductive material comprises a conductive polymer.

5. The casing device of claim 1, wherein the electrically conductive material comprises a continuous piece in electrical communication.

6. The casing device of claim 1, wherein the at least one wall further comprises an electrically non-conductive material, and the electrically conductive material is embedded in the electrically non-conductive material.

7. The casing device of claim 1, wherein either the first wall portion or the second wall portion comprises a door for allowing access to the chamber.

8. The casing device of claim 7, wherein the door comprises hinges pivotably coupling the door to the first wall portion or the second wall portion.

9. The casing device of claim 1, wherein the second wall portion includes an electrically conductive material.

10. The casing device of claim 1, wherein the first amount is a first density of conductive material per volume of the first wall portion, wherein the second amount is a second density of conductive material per volume of the first wall portion.

11. A system for controlling the distance and direction of readability of a wave, the system comprising:

a casing device comprising at least one wall having an outer surface and an inner surface defining a chamber, the at least one wall having at least a first wall portion and a second wall portion, wherein at least the first wall portion includes an electrically conductive material, and wherein at least the second wall portion defines an aperture extending from the outer surface to the inner surface, wherein a first amount of electrically conductive material included in a first portion of electrically conductive material of one of the first wall portion or the second wall portion is different from a second amount of electrically conductive material included in a second portion of electrically conductive material of the one of the first wall portion or the second wall portion, wherein the first amount and the second amount are greater than zero, wherein the first portion of electrically conductive material reduces the readability of a wave signal transmitted through the first portion of electrically conductive material to a first minimum distance, and the second portion of electrically conductive material reduces the readability of the wave signal transmitted through the second portion of electrically conductive material to a second minimum distance, wherein the second minimum distance is greater than the first minimum distance; and a transmitting device disposed within the chamber, wherein the transmitting device is capable of transmitting the wave signal.

12. The system of claim 11, wherein the electrically conductive material comprises a metal.

13. The system of claim 12, wherein the electrically conductive material comprises copper.

14. The system of claim 11, wherein the electrically conductive material comprises a conductive polymer.

15. The system of claim 11, wherein the electrically conductive material comprises a continuous piece in electrical communication.

16. The system of claim 11, wherein the at least one wall further comprises an electrically non-conductive material, and the electrically conductive material is embedded in the electrically non-conductive material.

17. The system of claim 11, wherein either the first wall portion or the second wall portion comprises a door for allowing access to the chamber.

18. The system of claim 17, wherein the door comprises hinges pivotably coupling the door to the other of the second wall portion or first wall portion.

19. The system of claim 11, wherein the second wall portion includes an electrically conductive material.

20. The system of claim 11, wherein the first amount is a first density of conductive material per volume of the first wall portion, wherein the second amount is a second density of conductive material per volume of the first wall portion.

21. The system of claim 11, wherein the wave signal is electromagnetic interference (EMI).

22. The system of claim 11, wherein the wave signal is radio-frequency identification (RFID).

23. The system of claim 11, wherein the wave signal includes readable data, wherein the first wall portion is configured to include enough electrically conductive material such that the readable data of the wave signal transmitted through the first wall portion is not readable beyond a maximum distance from the transmitting device, wherein the maximum distance is less than 1 meter.

24. The system of claim 23, wherein a communication signal transmitted externally from the chamber through the first wall portion is not readable by the transmitting device beyond the maximum distance.

25. The system of claim 23, wherein the second wall portion is configured such that the readable data of the wave signal transmitted through the aperture of the second wall portion is readable at a distance beyond the maximum distance.

26. The system of claim 25, wherein the distance that the readable data of the wave signal transmitted through the aperture of the second wall portion is from 30 meters to greater than 1 meter.

\* \* \* \* \*